(12) United States Patent
Chen et al.

(10) Patent No.: US 11,211,535 B2
(45) Date of Patent: Dec. 28, 2021

(54) METHOD FOR FABRICATING MICRO LIGHT-EMITTING DIODE DISPLAY

(71) Applicant: PlayNitride Display Co., Ltd., Miaoli County (TW)

(72) Inventors: Yi-Ching Chen, Miaoli County (TW); Pei-Hsin Chen, Miaoli County (TW); Yi-Chun Shih, Miaoli County (TW); Tzu-Yang Lin, Miaoli County (TW); Yu-Hung Lai, Miaoli County (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 48 days.

(21) Appl. No.: 16/727,502

(22) Filed: Dec. 26, 2019

(65) Prior Publication Data

US 2020/0388736 A1 Dec. 10, 2020

(30) Foreign Application Priority Data

Jun. 6, 2019 (TW) .................................. 108119634

(51) Int. Cl.
*H01L 33/62* (2010.01)
*H01L 21/683* (2006.01)
(Continued)

(52) U.S. Cl.
CPC .......... *H01L 33/62* (2013.01); *H01L 21/6835* (2013.01); *H01L 22/22* (2013.01);
(Continued)

(58) Field of Classification Search
CPC . H01L 33/62; H01L 21/6835; H01L 25/0753; H01L 22/22; H01L 2221/68368;
(Continued)

(56) References Cited

U.S. PATENT DOCUMENTS

2017/0287867 A1* 10/2017 Liang ..................... H01L 24/83
2018/0261658 A1 9/2018 Cok et al.
(Continued)

FOREIGN PATENT DOCUMENTS

CN 108475712 A 8/2018

OTHER PUBLICATIONS

Office Action dated May 7, 2021 in corresponding Chinese Application No. 201910489997.4.

*Primary Examiner* — Vu A Vu
(74) *Attorney, Agent, or Firm* — Birch, Stewart, Kolasch & Birch, LLP

(57) ABSTRACT

A method for fabricating a micro light-emitting diode display is provided. The method includes disposing a plurality of micro light-emitting diodes on a carrier; transferring the micro light-emitting diodes from the carrier to a display substrate and disposing the micro light-emitting diodes in a plurality of pixels of the display substrate; subjecting the micro light-emitting diodes to a pre-bonding process to electrically connect the micro light-emitting diodes to the display substrate; subjecting the micro light-emitting diodes pre-bonded to the display substrate to a first detection process, thereby identifying whether a faulty micro light-emitting diode is present or not; and, subjecting the micro light-emitting diodes to the main bonding process after the first detection process.

11 Claims, 7 Drawing Sheets

(51) Int. Cl.
*H01L 25/075* (2006.01)
*H01L 21/66* (2006.01)

(52) U.S. Cl.
CPC .............................. *H01L 25/0753* (2013.01); *H01L 2221/68368* (2013.01); *H01L 2933/0066* (2013.01)

(58) Field of Classification Search
CPC ......... H01L 2933/0066; H01L 33/0095; H01L 22/20; H01L 22/12; H01L 22/14
USPC ............................................................ 438/4
See application file for complete search history.

(56) References Cited

U.S. PATENT DOCUMENTS

2019/0148611 A1   5/2019   He et al.
2020/0152827 A1*  5/2020   Chen .................. H01L 33/0095

\* cited by examiner

METHOD FOR FABRICATING MICRO LIGHT-EMITTING DIODE DISPLAY

CROSS REFERENCE TO RELATED APPLICATIONS

This Application claims priority of Taiwan Patent Application No. 108119634, filed on Jun. 6, 2019, the entirety of which is incorporated by reference herein.

BACKGROUND

Field of the Disclosure

The present disclosure relates to a method for fabricating a micro light-emitting diode display.

Description of the Related Art

With the advancements being made in the field of optoelectronic technology, the size of optoelectronic components has gradually evolved toward miniaturization. In recent years, due to breakthroughs in the size of light-emitting diodes (LEDs), the micro light-emitting diodes (micro LED) display, in which the micro LEDs are arranged in an array, has increasingly interested people in the field. A micro LED display is a self-luminous display, and it is more energy efficient than organic light-emitting diode (OLED) displays. Furthermore, a micro LED display has better contrast performance than an OLED display, and it is visible in sunlight. In addition, since micro LED displays use inorganic material, they are more reliable and have a longer lifetime than OLED displays.

As display size and resolution increase, it becomes more difficult to manufacture displays without any pixel defects and therefore manufacturing yields decrease and costs increase. Therefore, a novel method for fabricating the micro light-emitting diode display is desired for solving the aforementioned problems.

BRIEF SUMMARY

According to embodiments of the disclosure, the disclosure provides a method for fabricating a micro light-emitting diode display. The method can include following these steps: disposing a plurality of micro light-emitting diodes on a carrier; transferring the micro light-emitting diodes to a display substrate and disposing the micro light-emitting diodes in a plurality of pixels of the display substrate; subjecting the micro light-emitting diodes to a pre-bonding process; subjecting the micro light-emitting diodes pre-bonded to the display substrate to a first detection process, thereby identifying whether a faulty micro light-emitting diode is present or not; and, subjecting the micro light-emitting diodes to the main bonding process after the first detection process.

According to embodiments of the disclosure, the first detection process is an electrical detection.

According to embodiments of the disclosure, the pixel having the faulty micro light-emitting diode is repaired after it is identified.

According to embodiments of the disclosure, in the first detection process, the electroluminescent properties or electrical signals of the micro light-emitting diode are measured.

According to embodiments of the disclosure, the method for fabricating the micro light-emitting diode display further includes: subjecting the micro light-emitting diodes on the carrier to a second detection process and identifying good micro light-emitting diodes of the micro light-emitting diodes on the carrier; and transferring the good micro light-emitting diodes to the display substrate and disposing the micro light-emitting diodes in a plurality of pixels of the display substrate; and subjecting the good micro light-emitting diodes to the pre-bonding process.

According to embodiments of the disclosure, the second detection process is an optical detection.

According to embodiments of the disclosure, in the second detection process, the photoluminescent properties of the micro light-emitting diode are measured or the optical image of the micro light-emitting diode is obtained.

According to embodiments of the disclosure, the step of repairing the pixel having faulty micro light-emitting diode can include replacing the faulty micro light-emitting diode with a known good micro light-emitting diode.

According to embodiments of the disclosure, the step of repairing the pixel having faulty micro light-emitting diode can include disconnecting an electrical connection between the faulty micro light-emitting diode and a control circuit of the display substrate; and electrically connecting a redundant micro light-emitting diode to the control circuit of the display substrate.

According to embodiments of the disclosure, there is a first bonding strength between the micro light-emitting diode and the display substrate after subjecting the micro light-emitting diode to the pre-bonding process, and there is a second bonding strength between the micro light-emitting diode and the display substrate after subjecting the micro light-emitting diode to the main bonding process, wherein the second bonding strength is greater than the first bonding strength.

According to embodiments of the disclosure, the bonding temperature of the pre-bonding process is lower than the bonding temperature of the main bonding process.

According to embodiments of the disclosure, the difference between the bonding temperature of the pre-bonding process and the bonding temperature of the main bonding process is greater than or equal to 100° C.

According to embodiments of the disclosure, the process pressure of the pre-bonding process is lower than the process pressure of the main bonding process.

According to embodiments of the disclosure, the difference between the process pressure of the pre-bonding process and the process pressure of the main bonding process is greater than or equal to 20 kgf/cm$^2$.

According to embodiments of the disclosure, the process period of the pre-bonding process is lower than the process period of the main bonding process.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION

Figure 1:
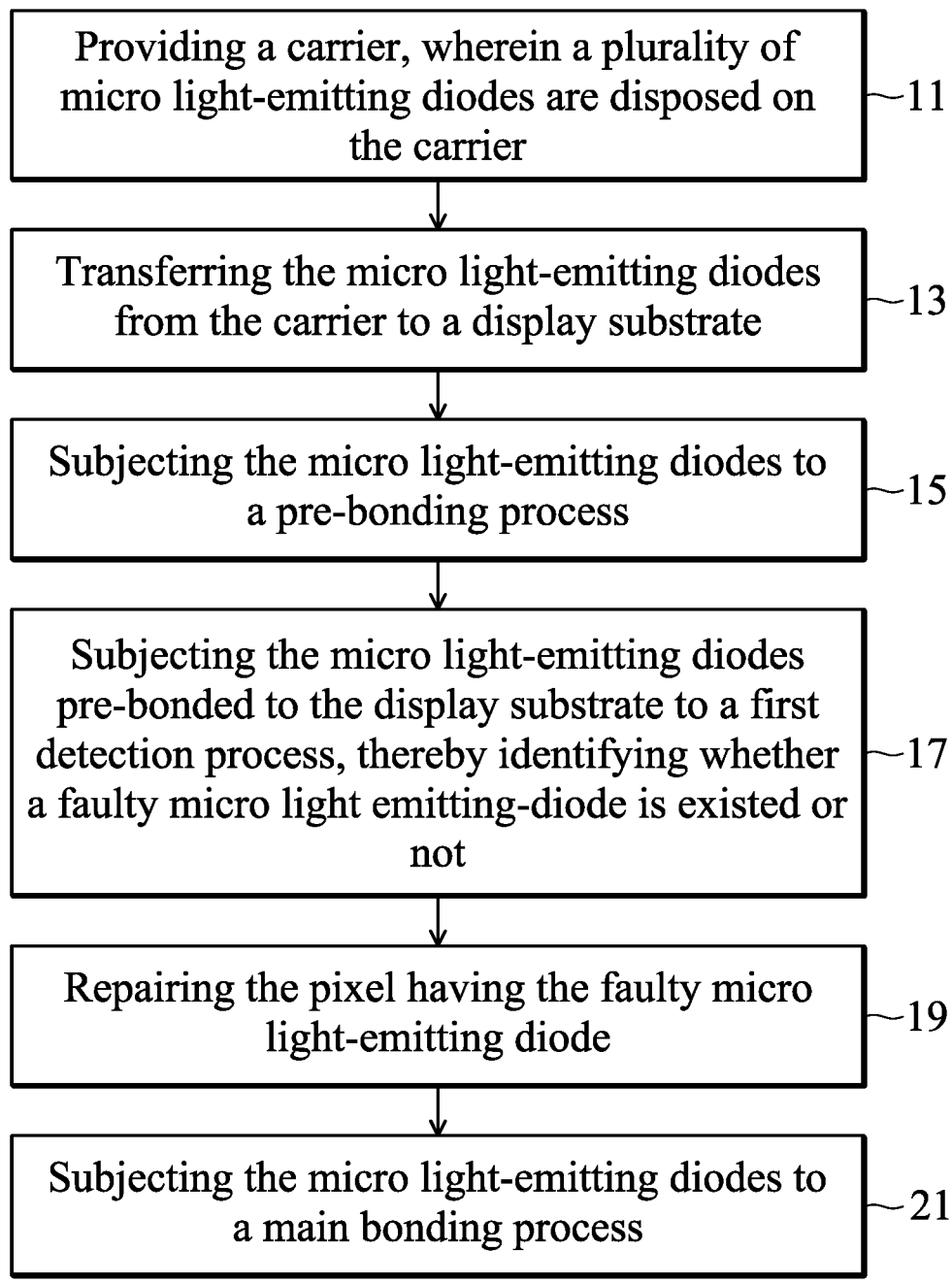
FIG. 1 shows a flow chart illustrating the method for fabricating the micro light-emitting diode display according to an embodiment of the disclosure.

The micro light-emitting diode display of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that is in direct contact with the other layer, and they may also refer to a layer hat does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

In general, in the micro light-emitting diode display, yield testing would be analyzed after permanently bonding the micro light-emitting diodes to the display substrate. However, the process for repairing a micro light-emitting diode which is permanently bonded to the display substrate is more complicated and expensive. The disclosure provides a method for fabricating a micro light-emitting diode display. In the method, the micro light-emitting diodes are temporarily bonded to the display substrate via a pre-bonding process. As a result, the micro light-emitting diode can be electrically connected to the control circuit of the display substrate, in order to facilitate electrical detection of the micro light-emitting diodes. In addition, since the micro light-emitting diodes are temporarily bonded to the display substrate via the pre-bonding process, the micro light-emitting diodes are not firmly bonded to the display substrate (i.e. the bonding strength between the micro light-emitting diode and the display substrate is weak). As a result, when a faulty micro light-emitting diode is identified via electrical detection, the micro light-emitting diode temporarily bonded to the display substrate can be removed or repaired easily. After repairing the pixel having faulty micro light-emitting diode, the micro light-emitting diodes on the display substrate are subjected to the main bonding process, in order to permanently bond the micro light-emitting diode to the display substrate.

Figure 2:
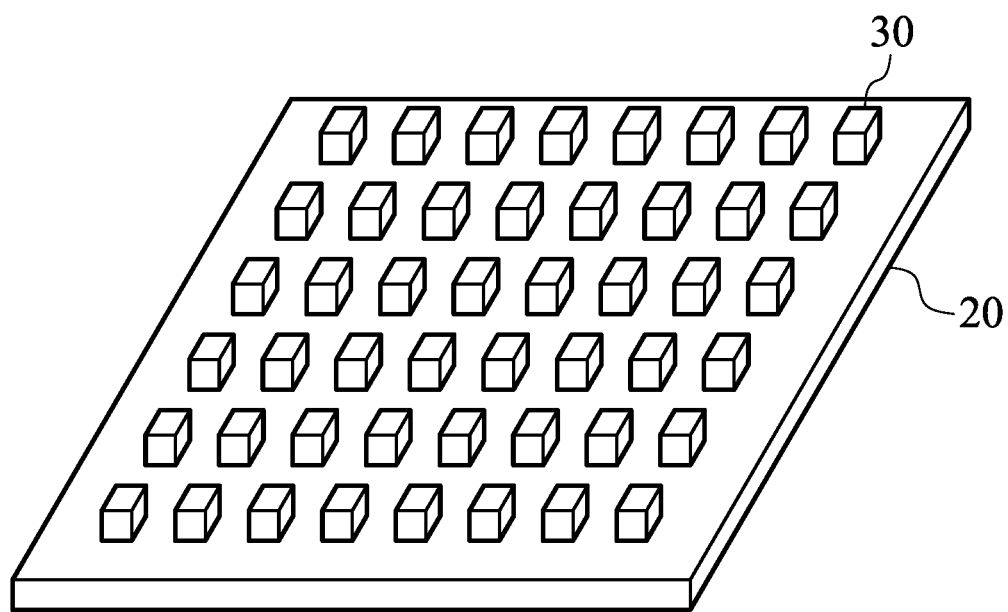
FIG. 2 is a schematic view of the carrier, which a plurality of micro light-emitting diodes are disposed thereon, according to an embodiment of the disclosure.

FIG. 1 shows a flow chart illustrating the method 10 for fabricating the micro light-emitting diode display according to an embodiment of the disclosure. FIGS. 2 to 7 are a series of schematic views showing the steps of fabricating the micro light-emitting diode display according to an embodiment of the disclosure. First, as shown in FIG. 2, a carrier 20 is provided, wherein a plurality of micro light-emitting diode 30 are disposed on the carrier 20 (step 11). According to embodiments of the disclosure, the carrier 20 can be a template for carrying the micro light-emitting diodes 30. The carrier 20 can be a plastic substrate, ceramic substrate, glass substrate, sapphire substrate, or another rigid substrate. According to some embodiments of the disclosure, a tether (not shown) can be disposed on the carrier for keeping a specific distance between two adjacent micro light-emitting diodes 30.

The micro light-emitting diode of the disclosure means a light-emitting diode which has a length, width and height within a range of 1 μm to 100 μm. According to embodiments of the disclosure, the micro light-emitting diode may have a maximum width of 20 μm, 10 μm, or 5 μm. In some embodiments, the micro light-emitting diode may have a maximum height of 10 μm or 5 μm. However, it should be understood that embodiments of the present invention are not limited thereto, and aspects of certain embodiments may be applied to larger and perhaps smaller scales.

In addition, compared with the general light-emitting diode technology, the dimension of the micro light-emitting diode is reduced from the millimeter level to the micron level, and therefore the micro light-emitting diode of the disclosure is transferred, integrated and assembled to obtain a micro LED display. The resulting micro LED display can achieve high resolution and reduce power consumption of the display, and therefore, it has many advantages: it is energy-saving, it has a simple mechanism, it is thin, and so on.

According to embodiments of the disclosure, the micro light-emitting diode of the disclosure can be a horizontal structure micro light-emitting diode (i.e. the two electrodes (not shown) are disposed on the same side of the micro light-emitting diode) or a vertical structure micro light-emitting diode (i.e. the two electrodes are opposite to each other). As shown in FIG. 2, the micro light-emitting diode of the disclosure is shown as a hexahedron in order to simplify the illustration.

Figure 3:
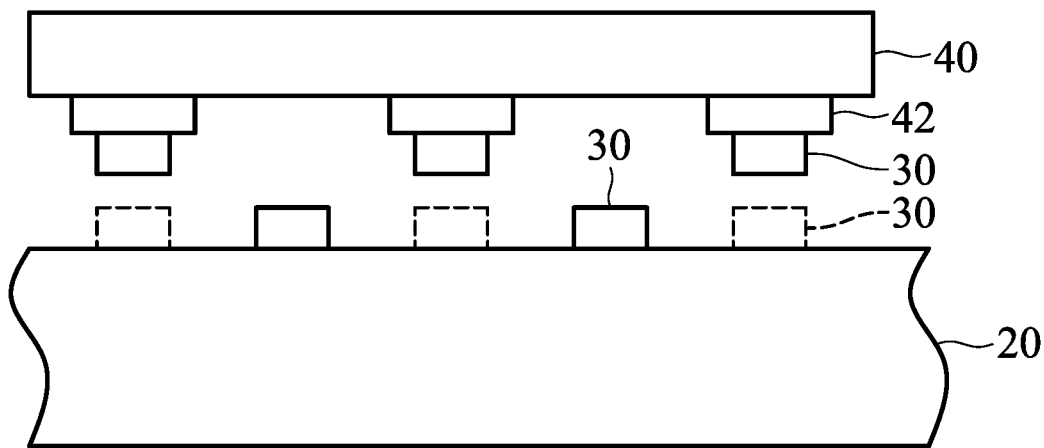
FIG. 3 is a schematic view showing the step of picking a plurality of micro light-emitting diodes up from the carrier according to an embodiment of the disclosure.
Figure 4:
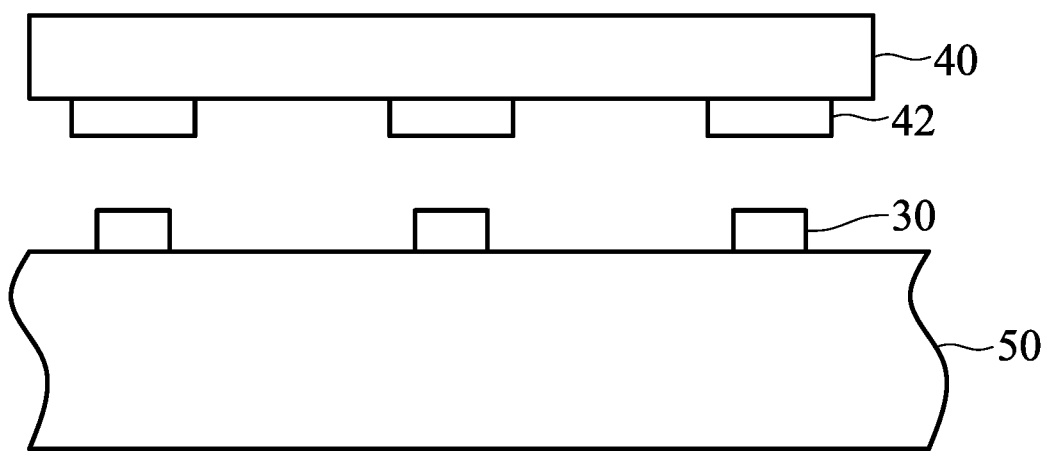
FIG. 4 is a schematic view showing the step of disposing a plurality of micro light-emitting diodes on the display substrate according to an embodiment of the disclosure.

Next, as shown in FIGS. 3 and 4, the micro light-emitting diodes 30 are transferred from the carrier 20 to a display substrate 50 (step 13). According to embodiments of the disclosure, a mass transfer process can be performed to transfer the micro light-emitting diodes 30 from the carrier 20 to the display substrate 50, and the micro light-emitting diodes are disposed in a plurality of pixels of the display substrate.

According to embodiments of the disclosure, a large number of the micro light-emitting diodes 30 can be transferred from the carrier 20 to the display substrate 50. For example, methods of mechanical electrostatic attraction or adhesion by adhesive tape are used to perform the transfer process. According to embodiments of the disclosure, the transfer process includes a pickup step and a dropoff step. As shown in FIG. 3, in the pickup step, the micro light-emitting diode 30 on the carrier 20 can be picked up by a pickup device 40 which employs a plurality of pickup units 42.

Next, as shown in FIG. 4, in the dropoff step, the micro light-emitting diodes 30 can be disposed on the display substrate 50 by the pickup device 40. According to embodiments of the disclosure, a plurality of control circuits (not shown) can be formed on the display substrate 50 in advance. After disposing each micro light-emitting diode 30 to a predetermined location, the micro light-emitting diode 30 can contact the contact pad of the corresponding control circuit.

Figure 5:
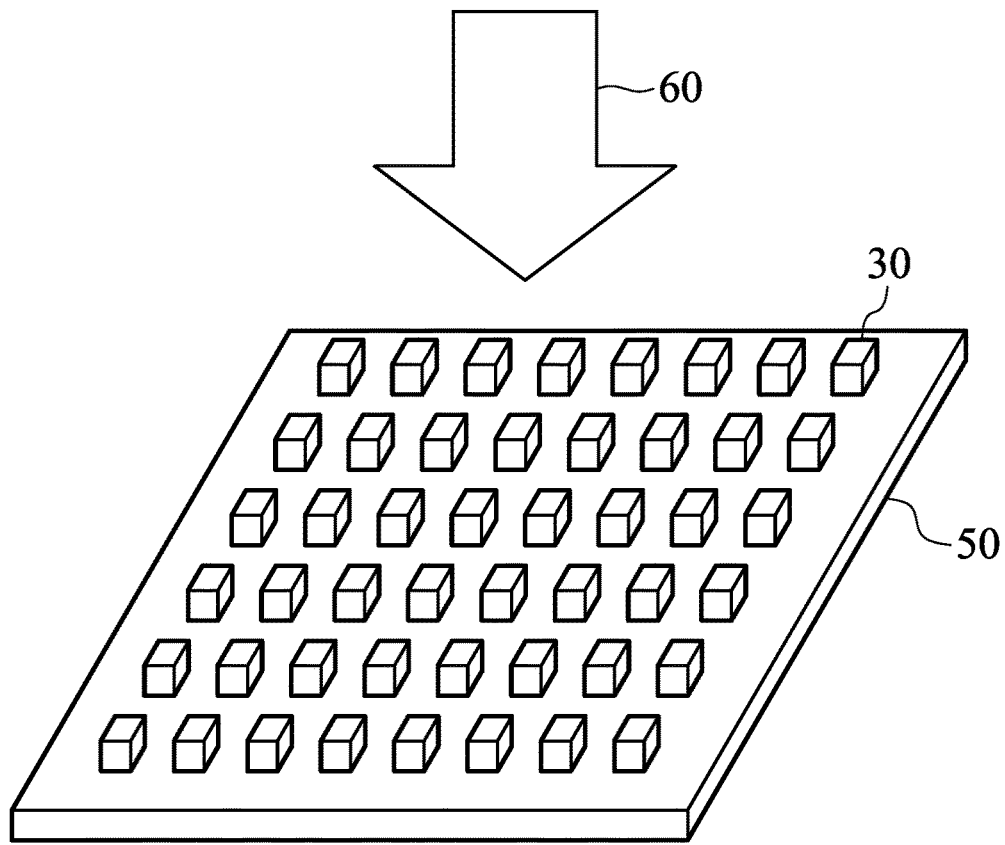
FIG. 5 is a schematic view showing the step of subjecting a plurality of micro light-emitting diodes to a pre-bonding process according to an embodiment of the disclosure.

Next, as shown in FIG. 5, the micro light-emitting diodes 30 are subjected to a pre-bonding process 60 (step 15), thereby electrically connecting the micro light-emitting diode 30 to the corresponding control circuit on the display substrate 50. In the pre-bonding process 60, the process temperature can be heated to a bonding temperature. Herein, the electrode of the micro light-emitting diode contacts the contact pad of the control circuit under an applied process pressure for a process period.

According to embodiments of the disclosure, the bonding temperature of the pre-bonding process 60 can be from 20° C. to 100° C. (such as from about 25° C. to 60° C.), the process period can be from about 1 s to 150 s. For example, the process period can be from about 1 s to 10 s when the pre-bonding process 60 employs a colloid adhesive for pre-bonding the micro light-emitting diode 30; or in other embodiment, the process period can be from about 50 s to 150 s when the pre-bonding process 60 employs an eutectic bonding for pre-bonding the micro light-emitting diode 30.

After subjecting the micro light-emitting diode to the pre-bonding process, there is a first bonding strength between the micro light-emitting diode 30 and the display substrate, thereby temporarily bonding the micro light-emitting diode 30 on the display substrate 50. As a result, the micro light-emitting diode can be electrically connected to the control circuit of the display substrate, in order to facilitate the electrical detection for the micro light-emitting diodes. Herein, the phrase "temporarily bonding the micro light-emitting diode on the display substrate" means that there is a weaker bonding strength between the micro light-emitting diode and the display substrate so that the micro light-emitting diode is apt to be removed easily from the display substrate without damaging the control circuit of the display substrate. The phrase "bonding strength between the micro light-emitting diode and the display substrate" means the shear adhesion of the micro light-emitting diode disposed on the display substrate, and the shear adhesion of the micro light-emitting diode can be determined in accordance with ASTM D1002.

Figure 6:
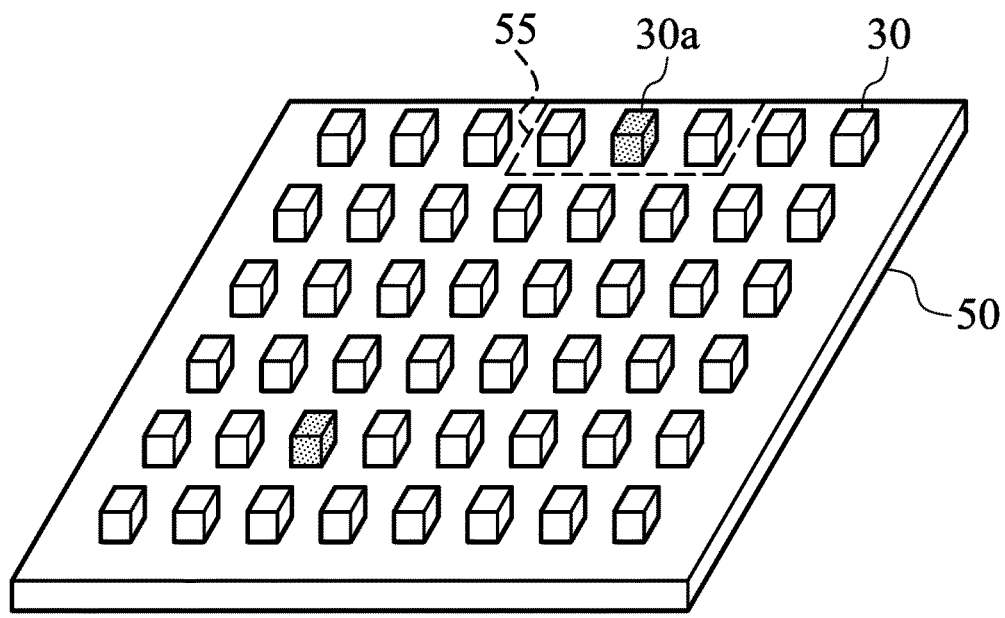
FIG. 6 is a schematic view showing the step of subjecting a plurality of micro light-emitting diodes to a first detection process according to an embodiment of the disclosure.

According to embodiments of the disclosure, subjecting the micro light-emitting diode to the pre-bonding process, the micro light-emitting diode 30 disposed on the display substrate 50 is subjected to a first detection process, thereby identifying the faulty micro light-emitting diode 30a (step 17), as shown in FIG. 6. The purpose of the first detection process is to identify whether any defect or flaw in the micro light-emitting diode is present or not before performing the main bonding process. As a result, the faulty micro light-emitting diode can be identified and then the pixel 55 having the faulty micro light-emitting diode 30a is repaired before the micro light-emitting diode display assembly. According to embodiments of the disclosure, the first detection process can be an electrical detection in order to accurately measure the electrical parameter variation or the alignment precision. If the bonding strength between the micro light-emitting diode and the display substrate after the pre-bonding process is too large, the faulty micro light-emitting diode cannot be removed easily from the display substrate, or the control circuit of the display substrate may be damaged. If the bonding strength between the micro light-emitting diode and the display substrate after the pre-bonding process is too small, the micro light-emitting diode is not apt to be electrically connected to the control circuit of the display substrate so that the subsequent electrical detection step cannot be performed on the micro light-emitting diode.

According to some embodiments of the disclosure, the control circuit of the display substrate can have a plurality of signal lines (such as signal lines for p-type electrode or signal lines for n-type electrode). In addition, there are a plurality of test signal input pads (such as test signal input pads for p-type electrode or test signal input pads for n-type electrode) disposed on the display substrate, wherein the signal lines are electrically connected to the test signal input pads via fan-out lines.

In the first detection process, test signals can be delivered to the micro light-emitting diode via the signal lines. As a result, the open circuit or short circuit (e.g. resulted from misalignment of the micro light-emitting diode) can be detected via the first detection process. Furthermore, the electroluminescent properties (such as color, brightness, driving voltage, or driving current) of the micro light-emitting diode can be determined via the first detection process, thereby identifying the faulty micro light-emitting diode 30a.

In general, additional test circuits for input test signals are disposed on the peripheral region (non-display region) and cause to the display region be reduced. According to some embodiments of the disclosure, there are no additional test circuits disposed on the display substrate of the disclosure, and the first detection process is a contactless electrical detection of the micro light-emitting diode to identify faulty micro light-emitting diodes.

For example, during the contactless electrical detection, a detection device can be mounted above the display substrate (for example the distance between the display substrate and the detection device is from about 50 μm to 500 μm), wherein the detection device has signal output units for transmitting test signals and signal receiving units for collecting feedback signals. During the contactless electrical detection, detection device can move alone the electrical signal lines of the control circuit. The contactless electrical detection can identify the faulty micro light-emitting diode 30a by detecting capacitance coupling signals or magnetic coupling signals.

Next, the pixel 55 having the faulty micro light-emitting diode is repaired (step 19). According to some embodiments of the disclosure, the method for repairing the pixel 55 on the display substrate can include following these steps. First, the faulty micro light-emitting diode on the display substrate can be removed. Since the faulty micro light-emitting diode is bonded to the display substrate via a pre-bonding process temporarily (i.e. the electrical detection is performed successively after the pre-bonding process), the faulty micro light-emitting diode is not firmly bonded to the display substrate (i.e. the electrical detection is performed before the main bonding process). As a result, the faulty micro light-emitting diode can be removed easily from the display substrate without damaging the control circuit of the display substrate.

Next, the known good micro light-emitting diode is replaced with the faulty micro light-emitting diode. Namely, the known good micro light-emitting diode is disposed in the location of the display substrate on which the faulty micro light-emitting diode was originally disposed.

According to some embodiments of the disclosure, the method for repairing the pixel 55 having the faulty micro light-emitting diode on the display substrate can also include following these steps. First, the electrical connection between the faulty micro light-emitting diode and the control circuit of the display substrate is disconnected. Next, a redundant micro light-emitting diode is electrically connected to the control circuit of the display substrate. According to embodiments of the disclosure, the electrical connection between the faulty micro light-emitting diode and the control circuit of the display substrate can be disconnected by a laser beam.

According to some embodiments of the disclosure, in step 13, a plurality of micro light-emitting diodes are transferred to the display substrate, wherein a plurality of micro light-emitting diodes include a plurality of primary micro light-emitting diode and a plurality of redundant micro light-emitting diodes. The redundant micro light-emitting diodes and the primary micro light-emitting diode can be transferred to the display substrate in the same transfer process or a different one. In addition, in step 17, a plurality of primary micro light-emitting diodes are subjected to the first detection process in order to identify a faulty micro light-emitting diode among the primary micro light-emitting diodes. According to embodiments of the disclosure, the primary micro light-emitting diode is disposed adjacent to the corresponding redundant micro light-emitting diode.

According to some embodiments of the disclosure, at least one of the faulty micro light-emitting diode on the display substrate can be removed and replaced with a known good micro light-emitting diode; and, other faulty micro light-emitting diodes on the display substrate can be electrically disconnected with the control circuit of the display substrate, and then a redundant micro light-emitting diode can be electrically connected to the control circuit of the display substrate.

Figure 7:
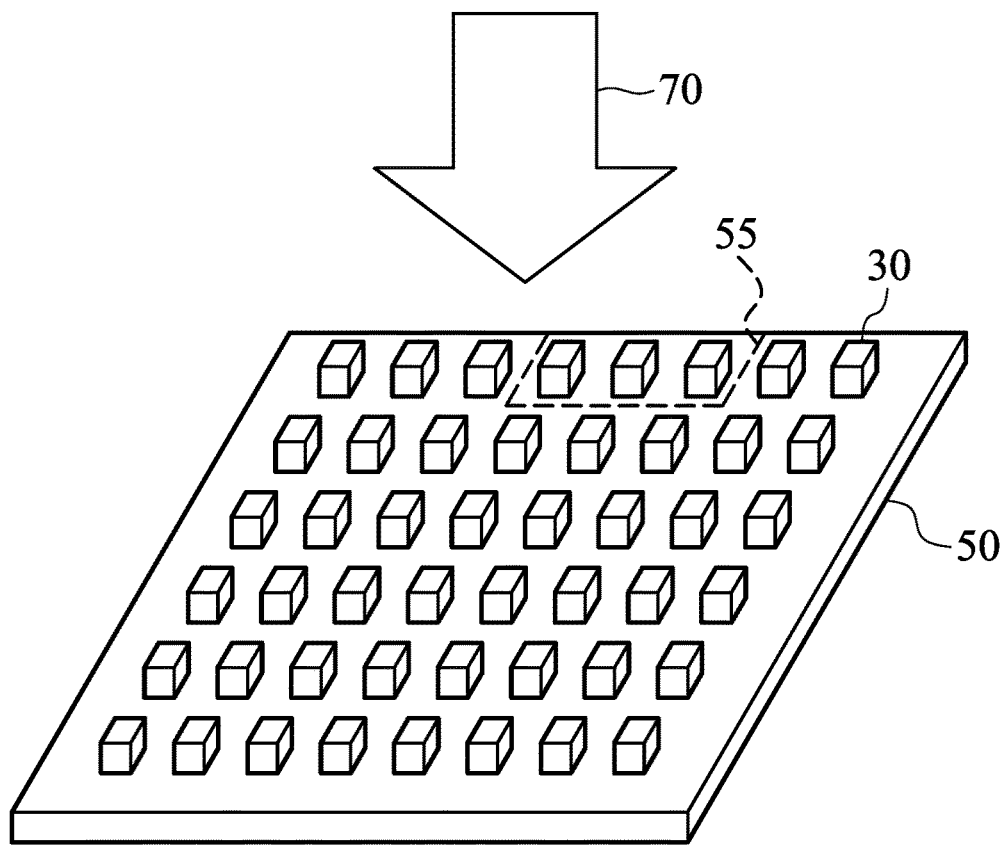
FIG. 7 is a schematic view illustrating the step of subjecting a plurality of micro light-emitting diodes to the main bonding process according to an embodiment of the disclosure.

Finally, as shown in FIG. 7, the micro light-emitting diodes 30 (including the known good micro light-emitting diodes) are subjected to the main bonding process 70 (step 21), thereby permanently bonding the micro light-emitting diode 30 to the display substrate. In the main bonding process 70, the micro light-emitting diode 30 can be heated to a bonding temperature. Furthermore, the micro light-emitting diode 30 can be applied a process pressure for a process period. According to embodiments of the disclosure, the bonding temperature of the main bonding process 70 can be from about 120° C. to 400° C. and the process period can be from about 2 s to 400 s.

After the main bonding process 70, there is a second bonding strength between the micro light-emitting diode 30 and the control circuit, thereby permanently bonding the micro light-emitting diode 30 to the display substrate 50. As a result, the micro light-emitting diode can be electrically connected to the control circuit of the display substrate, obtaining a micro light-emitting diode device. Herein, the phrase "permanently bonding the micro light-emitting diode to the display substrate" means that there is a stronger bonding strength between the micro light-emitting diode and the display substrate so that the micro light-emitting diode is not apt to be removed from the display substrate.

According to embodiments of the disclosure, there is a first bonding strength between the micro light-emitting diode and the display substrate after subjecting the micro light-emitting diode to the pre-bonding process, and there is a second bonding strength between the micro light-emitting diode and the display substrate after subjecting the micro light-emitting diode to the main bonding process. According to embodiments of the disclosure, wherein the second bonding strength is greater than the first bonding strength. According to some embodiments of the disclosure, the difference between the second bonding strength and the first bonding strength is from about 20 Kgf/cm$^2$ to 100 Kgf/cm$^2$.

According to embodiments of the disclosure, the bonding temperature of the pre-bonding process is lower than the bonding temperature of the main bonding process. According to some embodiments of the disclosure, the difference between the bonding temperature of the pre-bonding process and the bonding temperature of the main bonding process is greater than or equal to 100° C.

According to embodiments of the disclosure, the process pressure of the pre-bonding process is lower than the process pressure of the main bonding process. According to some embodiments of the disclosure, the difference between the process pressure of the pre-bonding process and the process pressure of the main bonding process is greater than or equal to 20 Kgf/cm$^2$.

According to embodiments of the disclosure, if the process pressure of the pre-bonding process is equal to the process pressure of the main bonding process (with/without the sane process temperature), the process period of the pre-bonding process can be lower than the process period of the main bonding process.

Figure 8:
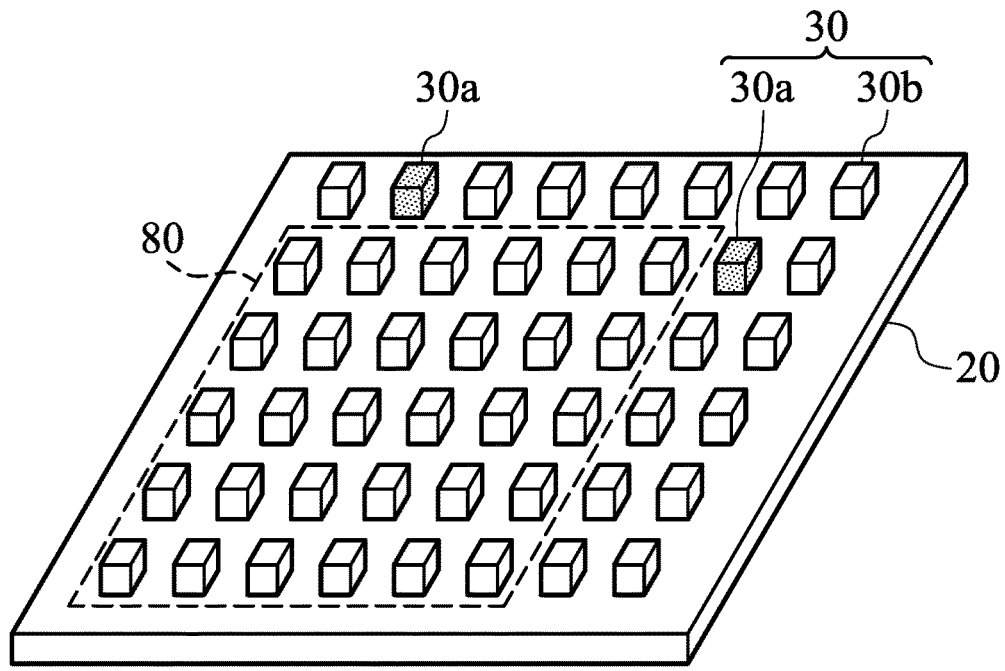
FIG. 8 is a schematic view illustrating the step of subjecting a plurality of micro light-emitting diodes to a second detection process according to an embodiment of the disclosure.

In addition, according to some embodiments of the disclosure, before transferring the plurality of micro light-emitting diodes 30 form the carrier 20 to the display substrate 50, the micro light-emitting diodes on the carrier can be subjected to a second detection process in order to identify the faulty micro light-emitting diodes 30a and the good micro light-emitting diodes 30b, as shown in FIG. 8. As a result, before subjecting the micro light-emitting diodes to the transfer process, the good micro light-emitting diodes 30b can be initially identified, thereby avoiding to transfer the faulty micro light-emitting diode 30a to the display substrate 50. Therefore, the repair process for the pixel having the faulty micro light-emitting diode disposed on the display substrate can be reduced.

According to embodiments of the disclosure, the second detection process can be an optical detection, and the photoluminescent properties (such as photoluminescent light-emitting wavelength) of the micro light-emitting diode is measured or the optical image (such as the image of the appearance of the epitaxial layer or electrode) of the micro light-emitting diode is obtained, thereby identifying the faulty micro light-emitting diodes 30a and the good micro light-emitting diodes 30b.

According to embodiments of the disclosure, a detection device can be used to determine the photoluminescent properties of the micro light-emitting diode. The detection device can have a detection light source and a light sensing unit. The detection light source can produce a light with specific wavelength and the micro light-emitting diode is irradiated by the detection light source, resulting in that the micro light-emitting diode produces light emission via photoluminescence. Next, the light sensing unit collects the light emission and then determines the wavelength of the light emission produced by the micro light-emitting diode. As a result, the faulty micro light-emitting diode 30a can be identified by means of the photoluminescent properties or the location information, obtained by the second detection process, of the micro light-emitting diode.

According to embodiments of the disclosure, the wavelength of the light produced by the detection light source (detection wavelength) is lower than the wavelength of the light emission produced by the micro light-emitting diode (wavelength under test). Namely, the energy of the light produced by the detection light source is greater than the energy of the light emission produced by the micro light-emitting diode. As a result, the micro light-emitting diode can produce light emission via photoluminescence after being irradiated by the detection light source.

According to some embodiments of the disclosure, the difference between the detection wavelength and the wavelength under test is greater than or equal to 50 nm. According to some embodiments of the disclosure, the difference between the detection wavelength and the wavelength under test is lower than or equal to 150 nm. According to some embodiments of the disclosure, the difference between the detection wavelength and the wavelength under test is from 50 nm to 150 nm. If the difference between the detection wavelength and the wavelength under test is too small, the micro light-emitting diode would not be apt to produce light emission via photoluminescence after being irradiated by the detection light source. In addition, if the difference between the detection wavelength and the wavelength under test is too large, the accurateness of the detection would be reduced due to the influence of noises. For example, when the micro light-emitting diode is a green micro light-emitting diode (with a light-emitting wavelength of about 530 nm) or a blue micro light-emitting diode (with a light-emitting wavelength of about 468 nm), the wavelength of the light produced by the detection light source is from about 390 nm to 415 nm (such as about 405 nm). When the micro light-emitting diode is a red micro light-emitting diode (with a light-emitting wavelength of about 625 nm), the wavelength of the light produced by the detection light source is from about 520 nm to 540 nm (such as about 532 nm).

According to embodiments of the disclosure, a detection device having a sensor can be used to obtain the optical images of the micro light-emitting diode. The optical images obtained by the detection device can be continuously delivered to an analysis system. The analysis system can identify whether an appearance defect of the micro light-emitting diode is present or not and determine the location of the micro light-emitting diode. As a result, the faulty micro light-emitting diode 30a can be identified. For example, the sensor of the detection device can be a line scan camera.

According to embodiments of the disclosure, after performing the second detection process, the good micro light-emitting diodes 30b can be transferred from the carrier 20 to the display substrate 50. The transfer process can transfer the good micro light-emitting diodes 30b one by one to avoid transferring the faulty micro light-emitting diode 30a. In addition, a good micro light-emitting diode array 80 (which does not include the faulty micro light-emitting diode 30a) can be transferred to the display substrate 50 in a batch.

According to some embodiments of the disclosure, the micro light-emitting diodes can include first-color micro light-emitting diodes (such as blue micro light-emitting diodes), second-color micro light-emitting diodes (such as green micro light-emitting diodes), and third-color micro light-emitting diodes (such as red micro light-emitting diodes).

Figure 9:
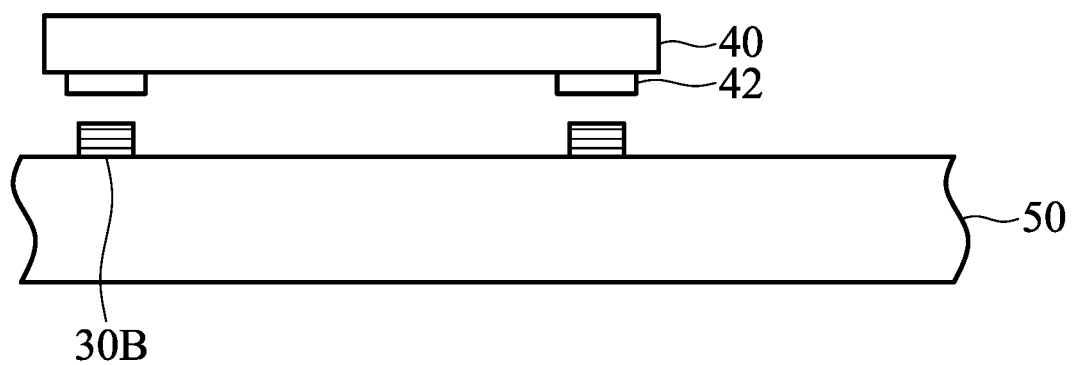
FIG. 9 is a schematic view illustrating the step of disposing a plurality of first-color micro light-emitting diodes on a display substrate according to an embodiment of the disclosure.

According to some embodiments of the disclosure, as shown in FIG. 9, a pickup device 40 having a plurality of pickup units 42 is used to pick up the first-color micro light-emitting diodes 30B from the carrier, and then to place the first-color micro light-emitting diodes 30B on the display substrate 50. Next, after subjecting the first-color micro light-emitting diodes 30B on the display substrate 50 to the pre-bonding process, the first-color micro light-emitting diodes 30B are subjected to a first detection process, and then the faulty first-color micro light-emitting diodes 30B are repaired.

Next, the pickup device 40 is used to pick up the second-color micro light-emitting diodes 30G from the carrier and then the second-color micro light-emitting diodes 30G are disposed on the display substrate 50 by the pickup device 40. Next, after subjecting the second-color micro light-emitting diodes 30G on the display substrate 50 to the pre-bonding process, the second-color micro light-emitting diodes 30G are subjected to the first detection process, and then the faulty second-color micro light-emitting diodes 30G are repaired.

Figure 10:
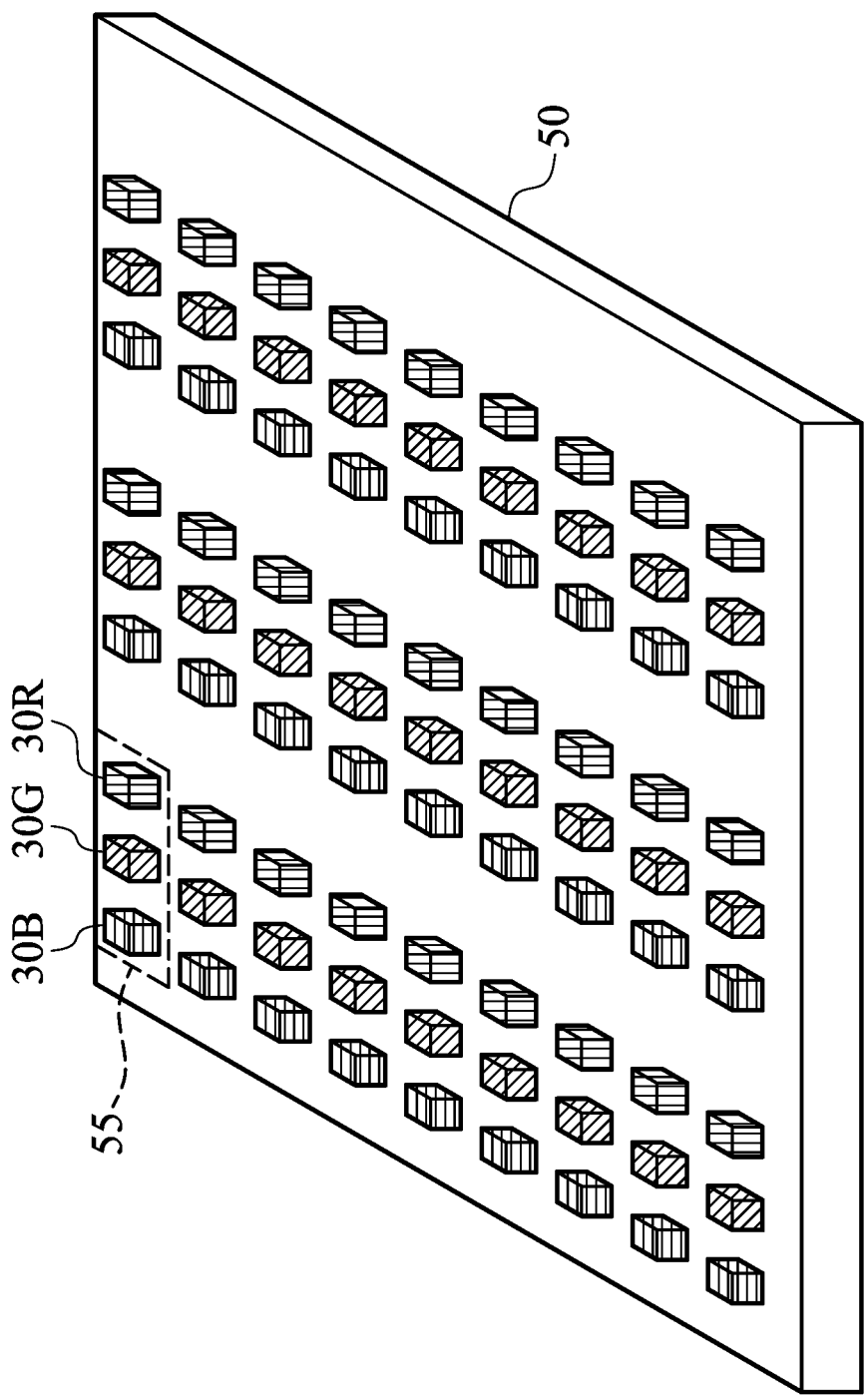
FIG. 10 is a schematic view illustrating the step of disposing a plurality of first-color micro light-emitting diodes, a plurality of second-color micro light-emitting diodes and a plurality of third-color micro light-emitting diodes on a display substrate according to an embodiment of the disclosure.

Next, the pickup device 40 is used to pick up the third-color micro light-emitting diodes 30R from the carrier, and then the third-color micro light-emitting diodes 30R are disposed on the display substrate 50 by the pickup device 40. Next, after subjecting the third-color micro light-emitting diodes 30R on the display substrate 50 to the pre-bonding process, the third-color micro light-emitting diodes 30R are subjected to the first detection process, and then the faulty third-color micro light-emitting diodes 30R are repaired. As a result, a display substrate 50, which has the pre-bonded and qualified first-color micro light-emitting diodes 30B, the second-color micro light-emitting diodes 30G and the third-color micro light-emitting diodes 30R (in the pixel 55) disposed thereon, is obtained, as shown in FIG. 10.

Herein, the first-color micro light-emitting diodes 30B, the second-color micro light-emitting diodes 30G and the third-color micro light-emitting diodes 30R are individually transferred to the display substrate 50, subjected to a pre-bonding process, a first detection process, and subjected a repair process. Afterwards, the first-color micro light-emitting diodes 30B, the second-color micro light-emitting diodes 30G and the third-color micro light-emitting diodes 30R are subjected to the main bonding process simultaneously, obtaining a display substrate 50 having various-color micro light-emitting diodes disposed thereon.

According to some embodiments of the disclosure, the first-color micro light-emitting diodes 30B, the second-color micro light-emitting diodes 300 and the third-color micro light-emitting diodes 30R can be transferred to the display substrate via the same transfer process.

According to some embodiments of the disclosure, after disposing the first-color micro light-emitting diodes 30B, the second-color micro light-emitting diodes 30G and the third-color micro light-emitting diodes 30R on the display substrate simultaneously, the first-color micro light-emitting diodes 30B, the second-color micro light-emitting diodes 30G and the third-color micro light-emitting diodes 30R are subjected to the pre-bonding process simultaneously.

According to some embodiments of the disclosure, after subjecting the first-color micro light-emitting diodes 30B, the second-color micro light-emitting diodes 30G and the third-color micro light-emitting diodes 30R to the pre-bonding process, the first-color micro light-emitting diodes 30B, the second-color micro light-emitting diodes 30G and the third-color micro light-emitting diodes 30R are subjected to the first detection process simultaneously. Furthermore, the identified faulty micro light-emitting diodes are subjected to a repair process.

According to some embodiments of the disclosure, after subjecting first-color micro light-emitting diodes 30B, the second-color micro light-emitting diodes 30G and the third-color micro light-emitting diodes 30R to the first detection process and the repair process, the first-color micro light-emitting diodes 30B, the second-color micro light-emitting diodes 30G and the third-color micro light-emitting diodes 30R are subjected to the main bonding process.

According to some embodiments of the disclosure, while the first-color micro light-emitting diodes 30B, the second-color micro light-emitting diodes 30G and the third-color micro light-emitting diodes 30R are disposed on the carrier, the first-color micro light-emitting diodes 30B, the second-color micro light-emitting diodes 30G, and the third-color micro light-emitting diodes 30R can be subjected to the second detection process individually or simultaneously. The second detection process is the same as defined above.

According to embodiments of the disclosure, the micro light-emitting diode display can include other components depending on its application. These other components include (but are not limited to) memory, touch panel controllers, and batteries. In other embodiments, the micro light-emitting diode display can be a television, tablet computer, cell phone, laptop computer, computer monitor, stand-alone terminal server, digital camera, handheld game console, media display, electronics book display, car display or large area electronic board display.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for fabricating a micro light-emitting diode display, comprising:
    disposing a plurality of micro light-emitting diodes on a carrier;
    transferring the micro light-emitting diodes from the carrier to a display substrate and disposing the micro light-emitting diodes in a plurality of pixels of the display substrate;
    subjecting the micro light-emitting diodes to a pre-bonding process to electrically connect the micro light-emitting diodes to the display substrate;
    subjecting the micro light-emitting diodes pre-bonded to the display substrate to a first detection process, thereby identifying whether a faulty micro light-emitting diode is present or not; and
    subjecting the micro light-emitting diodes to a main bonding process after the first detection process,
    wherein the first detection process is an electrical detection, and the pixel having the faulty micro light-emitting diode is repaired after the faulty micro light-emitting diode is identified,
    wherein the micro light-emitting diodes subjected to the main bonding process comprise both identified good micro light-emitting diodes and the repaired micro light-emitting diode.

2. The method as claimed in claim 1, further comprising:
    subjecting the micro light-emitting diodes on the carrier to a second detection process and identifying good micro light-emitting diodes of the micro light-emitting diodes on the carrier; and
    transferring the good micro light-emitting diodes to the display substrate and subjecting the good micro light-emitting diodes to a pre-bonding process.

3. The method as claimed in claim 2, wherein the second detection process is an optical detection.

4. The method as claimed in claim 1, wherein the step of repairing the pixel having the faulty micro light-emitting diode comprises:
    replacing the faulty micro light-emitting diode with a known good micro light-emitting diode.

5. The method as claimed in claim 1, wherein the step of repairing the pixel having the faulty micro light-emitting diode comprises:
    disconnecting an electrical connection between the faulty micro light-emitting diode and a control circuit of the display substrate; and
    electrically connecting a redundant micro light-emitting diode to the control circuit of the display substrate.

6. The method as claimed in claim 1, wherein there is a first bonding strength between the micro light-emitting diode and the display substrate after subjecting the micro light-emitting diode to a pre-bonding process, and there is a second bonding strength between the micro light-emitting diode and the display substrate after subjecting the micro light-emitting diode to the main bonding process, wherein the second bonding strength is greater than the first bonding strength.

7. The method as claimed in claim 1, wherein the bonding temperature of the pre-bonding process is lower than the bonding temperature of the main bonding process.

8. The method as claimed in claim 7, wherein the difference between the bonding temperature of the pre-bonding process and the bonding temperature of the main bonding process is greater than or equal to 100° C.

9. The method as claimed in claim 1, wherein the process pressure of the pre-bonding process is lower than the process pressure of the main bonding process.

10. The method as claimed in claim 9, wherein the difference between the process pressure of the pre-bonding process and the process pressure of the main bonding process is greater than or equal to 20 kgf/cm$^2$.

11. The method as claimed in claim 1, wherein the process period of the pre-bonding process is lower than the process period of the main bonding process.

* * * * *